(12) United States Patent
Huang et al.

(10) Patent No.: US 9,893,165 B2
(45) Date of Patent: Feb. 13, 2018

(54) METHOD FOR MANUFACTURING ARRAY SUBSTRATE AND MANUFACTURING DEVICE

(71) Applicant: BOE TECHNOLOGY GROUP CO., LTD., Beijing (CN)

(72) Inventors: Jianbang Huang, Beijing (CN); Yucheng Chan, Beijing (CN); Chienhung Liu, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 92 days.

(21) Appl. No.: 14/905,733

(22) PCT Filed: Aug. 24, 2015

(86) PCT No.: PCT/CN2015/087920
§ 371 (c)(1),
(2) Date: Jan. 15, 2016

(87) PCT Pub. No.: WO2016/155215
PCT Pub. Date: Oct. 6, 2016

(65) Prior Publication Data
US 2017/0125546 A1    May 4, 2017

(30) Foreign Application Priority Data
Apr. 2, 2015 (CN) .......................... 2015 1 0155950

(51) Int. Cl.
*H01L 29/66* (2006.01)
*H01L 27/12* (2006.01)
(Continued)

(52) U.S. Cl.
CPC ...... *H01L 29/66492* (2013.01); *H01L 21/266* (2013.01); *H01L 21/28123* (2013.01);
(Continued)

(58) Field of Classification Search
CPC ............. H01L 21/0273; H01L 21/0274; H01L 29/66492; H01L 29/78621;
(Continued)

(56) References Cited

U.S. PATENT DOCUMENTS 6,586,287 B2 * 7/2003 Joo .................. H01L 29/66757
257/E21.413
7,306,980 B2 * 12/2007 Takehashi ......... H01L 29/66757
257/E21.413
(Continued)

FOREIGN PATENT DOCUMENTS

CN    101150092    3/2008
CN    101236904 A  8/2008
(Continued)

OTHER PUBLICATIONS

Office Action in Chinese Application No. 201510155950.6 dated Mar. 1, 2017, with English translation. 8 pages.
(Continued)

*Primary Examiner* — Jose R Diaz
(74) *Attorney, Agent, or Firm* — Blakely Sokoloff Taylor & Zafman LLP

(57) ABSTRACT

Embodiments of the present invention disclose a manufacturing method for an array substrate and corresponding manufacturing device, which belong to the technical field of metal oxide semiconductor. The method comprises: forming an active layer, a gate insulating layer and a gate metal layer successively on a substrate; forming a gate pattern with a gate photoresist pattern on the substrate having the gate metal layer; altering a temperature of the gate photoresist pattern, so as to enable the width of the gate photoresist sub-pattern in the gate photoresist pattern to be changed; forming lightly doped drains (LDDs) at two sides of a preset area of the active layer sub-pattern in the active layer of the substrate having the changed gate photoresist pattern, the
(Continued)

preset area being a projection area of the gate sub-pattern on the active layer sub-pattern, the length of each of the LDDs being (a−b)/2, wherein a is the width of the gate photoresist sub-pattern in the changed gate photoresist pattern, b is the width of the gate sub-pattern; stripping the changed gate photoresist pattern. The embodiment of the present invention mitigates or alleviates the problem of relatively low control flexibility and relatively poor feasibility to the LDD length, which improves the control flexibility and feasibility to the LDD length, and can be used for manufacturing an array substrate.

10 Claims, 12 Drawing Sheets

(51) Int. Cl.
H01L 21/28 (2006.01)
H01L 21/3105 (2006.01)
H01L 21/266 (2006.01)

(52) U.S. Cl.
CPC ...... *H01L 21/3105* (2013.01); *H01L 27/1288* (2013.01); *H01L 29/66757* (2013.01)

(58) Field of Classification Search
CPC ......... H01L 2029/7863; H01L 27/1288; H01L 21/266; H01L 21/28123
See application file for complete search history.

(56) References Cited

U.S. PATENT DOCUMENTS 7,682,881 B2* 3/2010 Park ................ H01L 27/1214
438/149
2002/0102785 A1 8/2002 Ho et al.
2007/0210377 A1 9/2007 Seo

FOREIGN PATENT DOCUMENTS

| CN | 101840865 | 9/2010 |
| CN | 103021820 | 4/2013 |
| CN | 104716092 | 6/2015 |

OTHER PUBLICATIONS

International Search Report and Written Opinion with English Language Translation, dated Oct. 29, 2015, Application No. PCT/CN2015/087920.

* cited by examiner

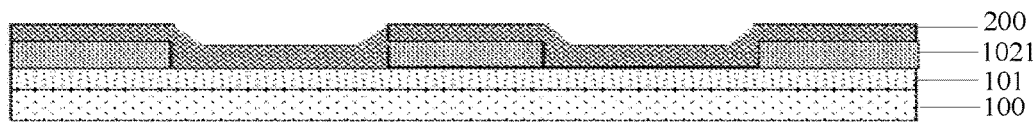
Fig. 7
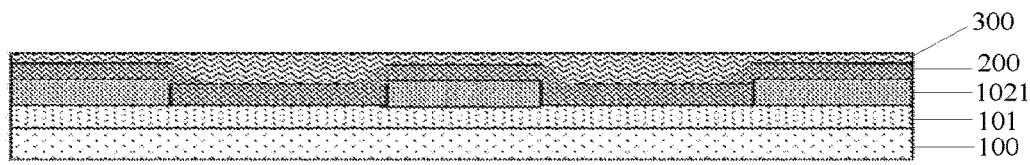
Fig. 8
| forming the gate photoresist pattern through a coating process, an exposing process and a developing process successively on the substrate having the gate metal layer | 2031 |
↓
| forming the gate metal layer having the gate photoresist pattern as the gate pattern through an etching process | 2032 |
Fig. 9

METHOD FOR MANUFACTURING ARRAY SUBSTRATE AND MANUFACTURING DEVICE

FIELD OF THE INVENTION

The present invention relates to the technical field of metal oxide semiconductor, particularly to a method for manufacturing an array substrate and manufacturing device.

BACKGROUND OF THE INVENTION

In the process of manufacturing the metal oxide semiconductor array substrate, the metal oxide semiconductor may produce thermo-electronic effect with the decrease of the channel length, which results in a relatively large drain current, degrades the electrical performance of the metal oxide semiconductor, and influences the manufacturing effect of the metal oxide semiconductor array substrate. Hence, the drain current needs to be restrained.

In the prior art, the drain current is mainly restrained by controlling the length of the lightly doped drain (LDD). The LDD is located at the active layer of the array substrate and is located below the gate, the length of the LDD is determined by the gate line width. Specifically, the length of the LDD can be controlled by prolonging or shortening the time for exposing the LDD, or the gate line width can be controlled by prolonging or shortening the time for etching the gate, so as to control the length of the LDD and achieve the aim of restraining the drain current finally.

However, when controlling the length of the LDD, on the one hand, etching the gate needs to consider the calculation accuracy and stability of the gate line width, meanwhile, when the gate line width is determined, the length of the LDD is also determined, so that the length of the LDD cannot be changed any more; on the other hand, the two processes of exposing the LDD and etching the gate cannot be performed simultaneously, the conditional requirement for controlling the gate line width and the conditional requirement for controlling the length of the LDD are mutually restricted, the conditional requirement of one party has to be sacrificed to meet the conditional requirement of the other party, i.e., the conditional requirement for the gate line width and the conditional requirement for the LDD length cannot be met simultaneously in the manufacturing process, hence, the existing method for manufacturing the array substrate has relatively low control flexibility and relatively poor feasibility to the LDD length.

SUMMARY OF THE INVENTION

In order to solve the problem of relatively low control flexibility and relatively poor feasibility to the LDD length in the existing method for manufacturing the array substrate, embodiments of the present invention provide a manufacturing method for an array substrate and a corresponding manufacturing device.

In one aspect, a method for manufacturing an array substrate is provided, the method comprises steps of:

forming an active layer, a gate insulating layer and a gate metal layer successively on a substrate, the active layer comprising a plurality of active layer sub-patterns;

forming a gate pattern with a gate photoresist pattern on the substrate having the gate metal layer, the gate pattern comprising a plurality of gate sub-patterns formed from the gate metal layer, the gate photoresist pattern comprising a plurality of gate photoresist sub-patterns, the width of each gate photoresist sub-pattern in the gate photoresist pattern being greater than the width of each gate sub-pattern in the gate pattern;

altering a temperature of the gate photoresist pattern, so as to enable the width of the gate photoresist sub-pattern in the gate photoresist pattern to be changed;

forming lightly doped drains (LDDs) at two sides of a preset area of the active layer sub-pattern in the active layer of the substrate having the changed gate photoresist pattern, the preset area being a projection area of the gate sub-pattern on the active layer sub-pattern, the length of each LDD is (a−b)/2, wherein a is the width of the gate photoresist sub-pattern in the changed gate photoresist pattern, b is the width of the gate sub-pattern in the gate pattern;

stripping the changed gate photoresist pattern.

In an embodiment, the step of altering a temperature of the gate photoresist pattern, so as to enable the width of the gate photoresist sub-pattern in the gate photoresist pattern to be changed comprises:

performing heating treatment to the gate photoresist pattern, so as to enable the width of the gate photoresist sub-pattern in the gate photoresist pattern to be lengthened.

In an embodiment, the step of altering a temperature of the gate photoresist pattern, so as to enable the width of the gate photoresist sub-pattern in the gate photoresist pattern to be changed comprises:

performing cooling treatment to the gate photoresist pattern, so as to enable the width of the gate photoresist sub-pattern in the gate photoresist pattern to be shortened.

In an embodiment, prior to altering a temperature of the gate photoresist pattern, so as to enable the width of the gate photoresist sub-pattern in the gate photoresist pattern to be changed, the method further comprises:

obtaining a thermal expansion and contraction coefficient of the gate photoresist pattern;

determining a length of the LDD that needs to be achieved;

determining a photoresist processing temperature based on the thermal expansion and contraction coefficient of the gate photoresist pattern and the length of the LDD that needs to be achieved;

and the step of altering a temperature of the gate photoresist pattern, so as to enable the width of the gate photoresist sub-pattern in the gate photoresist pattern to be changed comprises: processing the gate photoresist pattern at the photoresist processing temperature, so as to enable the width of the gate photoresist sub-pattern in the gate photoresist pattern to be changed.

In an embodiment, prior to altering a temperature of the gate photoresist pattern, so as to enable the width of the gate photoresist sub-pattern in the gate photoresist pattern to be changed, the method further comprises determining a processing duration based on the thermal expansion and contraction coefficient of the gate photoresist pattern and the length of the LDD that needs to be achieved;

and the step of altering a temperature of the gate photoresist pattern, so as to enable the width of the gate photoresist sub-pattern in the gate photoresist pattern to be changed comprises: during the processing duration, altering the temperature of the gate photoresist pattern, so as to enable the width of the gate photoresist sub-pattern in the gate photoresist pattern to be changed.

In an embodiment, the step of forming a gate pattern with a gate photoresist pattern on the substrate having the gate metal layer comprises:

forming the gate photoresist pattern through a coating process, an exposing process and a developing process successively on the substrate having the gate metal layer;

forming the gate metal layer having the gate photoresist pattern as the gate pattern through an etching process.

In an embodiment, prior to forming an active layer, a gate insulating layer and a gate metal layer successively on a substrate, the method further comprises forming a buffer layer on the substrate.

In an embodiment, the photoresist can be any one of organic resin materials of DL-1000, Dl-1000C and DTFR-JCW702 types.

In another aspect, a manufacturing device for an array substrate is provided, the manufacturing device may comprise:

a first forming unit for forming an active layer, a gate insulating layer and a gate metal layer successively on a substrate, the active layer comprising a plurality of active layer sub-patterns;

a second forming unit for forming a gate pattern with a gate photoresist pattern on the substrate having the gate metal layer, the gate pattern comprising a plurality of gate sub-patterns formed from the gate metal layer, the gate photoresist pattern comprising a plurality of gate photoresist sub-patterns, the width of each gate photoresist sub-pattern in the gate photoresist pattern being greater than the width of each gate sub-pattern in the gate pattern;

a temperature processing unit for altering a temperature of the gate photoresist pattern, so as to enable the width of the gate photoresist sub-pattern in the gate photoresist pattern to be changed;

a third forming unit for forming lightly doped drains (LDDs) at two sides of a preset area of the active layer sub-pattern in the active layer of the substrate having the changed gate photoresist pattern, the preset area being a projection area of the gate sub-pattern on the active layer sub-pattern, the length of each LDD being (a−b)/2, wherein a is the width of the gate photoresist sub-pattern in the changed gate photoresist pattern, b is the width of the gate sub-pattern in the gate pattern;

and a stripping unit for stripping the changed gate photoresist pattern.

In an embodiment, the temperature processing unit comprises a heat processing sub-unit for performing heating treatment to the gate photoresist pattern, so as to enable the width of the gate photoresist sub-pattern in the gate photoresist pattern to be lengthened.

In an embodiment, the temperature processing unit comprises a cool processing sub-unit for performing cooling treatment to the gate photoresist pattern, so as to enable the width of the gate photoresist sub-pattern in the gate photoresist pattern to be shortened.

In an embodiment, the manufacturing device for an array substrate further comprises:

an obtaining unit for obtaining a thermal expansion and contraction coefficient of the gate photoresist pattern;

a first determining unit for determining a length of the LDD that needs to be achieved;

a second determining unit for determining a photoresist processing temperature based on the thermal expansion and contraction coefficient of the gate photoresist pattern and the length of the LDD that needs to be achieved;

and the temperature processing unit may comprise a first processing sub-unit for processing the gate photoresist pattern at the photoresist processing temperature, so as to enable the width of the gate photoresist sub-pattern in the gate photoresist pattern to be changed.

In an embodiment, the manufacturing device for an array substrate further comprises a third determining unit for determining a processing duration based on the thermal expansion and contraction coefficient of the gate photoresist pattern and the length of the LDD that needs to be achieved; and the temperature processing unit comprises a second processing sub-unit for altering the temperature of the gate photoresist pattern during the processing duration, so as to enable the width of the gate photoresist sub-pattern in the gate photoresist pattern to be changed.

In an embodiment, the second forming unit comprises:

a first forming sub-unit for forming the gate photoresist pattern through a coating process, an exposing process and a developing process successively on the substrate having the gate metal layer;

a second forming sub-unit for forming the gate metal layer having the gate photoresist pattern as the gate pattern through an etching process.

In an embodiment, the manufacturing device for an array substrate further comprises a fourth forming unit for forming a buffer layer on the substrate.

The embodiments of the present invention provide a manufacturing method for an array substrate and corresponding manufacturing device. A gate pattern with a gate photoresist pattern is formed on the substrate having the gate metal layer, the width of the gate photoresist sub-pattern in the gate photoresist pattern can be changed by altering the temperature of the gate photoresist pattern, then LDDs that meet the length requirement are formed at two sides of a preset area of the active layer sub-pattern in the active layer of the substrate having the changed gate photoresist pattern, so that the length of the LDD is controlled, compared to the control method to the LDD length in the existing method for manufacturing the array substrate, the conditional requirement for the gate line width and the conditional requirement for the LDD length do not have to be met simultaneously, hence, the control flexibility and feasibility to the LDD length are improved.

It should be understood that the above general description and the following detailed description are only exemplary and explanatory, and cannot limit the present invention.

BRIEF DESCRIPTION OF THE DRAWINGS

In order to explain the technical solutions in the embodiments of the present invention more clearly, the drawings to be used in the description of the embodiments will be introduced briefly next. Apparently, the drawings described below are only some embodiments of the present invention, for the ordinary skilled person in the art, on the premise of not paying any creative work, other drawings can also be obtained from these drawings.

FIG. 1-2 is a schematic view illustrating a gate photoresist pattern width direction and a gate pattern width direction of an array substrate provided by an embodiment of the present invention;

FIG. 2 is a flow chart of a method for manufacturing an array substrate provided by another embodiment of the present invention;

FIG. 7 is a structural schematic view of forming a gate insulating layer on the substrate provided by an embodiment of the present invention;

FIG. 8 is a structural schematic view of forming a gate metal layer on the substrate provided by an embodiment of the present invention;

FIG. 9 is a flow chart of a method of forming a gate pattern with a gate photoresist pattern provided by an embodiment of the present invention;

The embodiments of the present invention have been shown by the above drawings, which will be described in more details in the following text. These drawings and literal description are used for explaining the concept of the present invention for the skilled person in the art by making reference to particular embodiments, rather than for limiting the scope of the concept of the present invention by any ways.

DETAILED DESCRIPTION OF THE INVENTION

In order to enable the objects, the technical solutions and the advantages of the present invention to be clearer, next, embodiments of the present invention will be described in more details with reference to the drawings.

Figure 1:
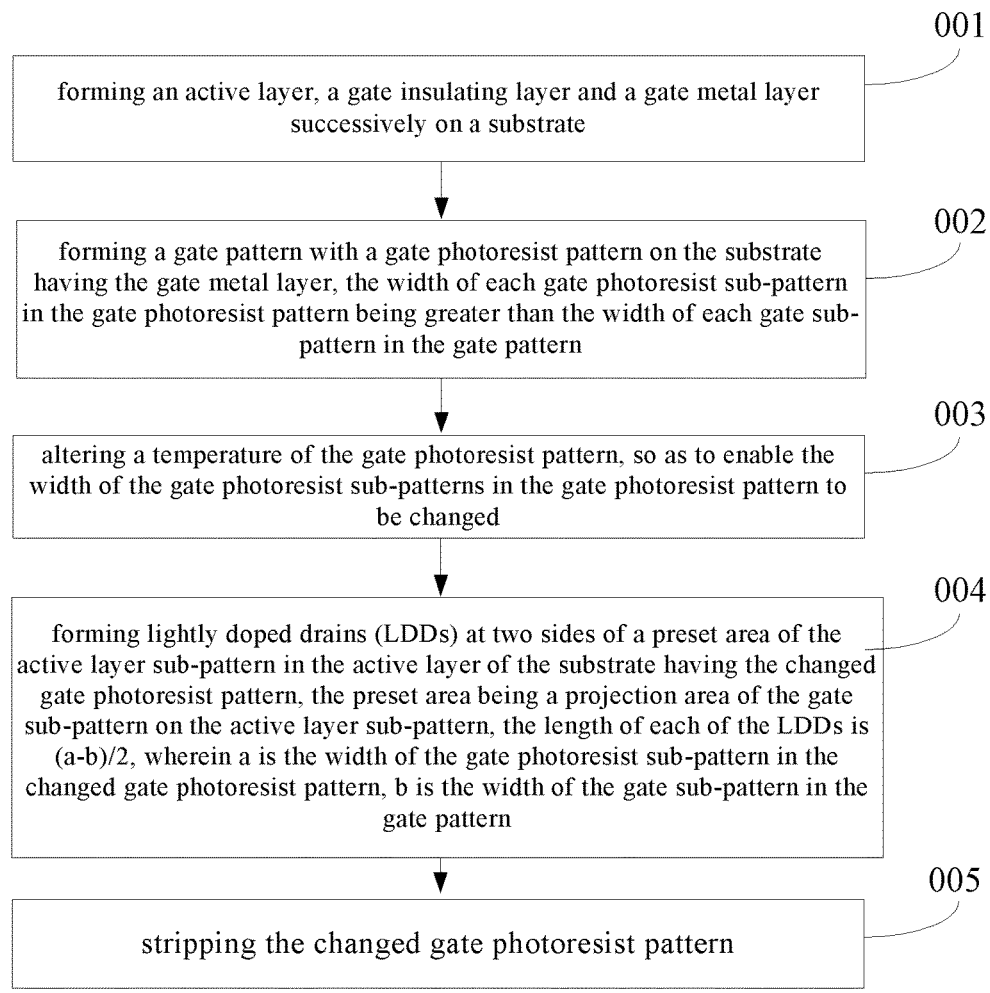
FIG. 1-1 is a flow chart of a method for manufacturing an array substrate provided by an embodiment of the present invention.

An embodiment of the present invention provides a method for manufacturing an array substrate, as shown in FIG. 1-1, the method may comprise:

Step 001, forming, on a substrate, an active layer, a gate insulating layer and a gate metal layer successively, the active layer comprising a plurality of active layer sub-patterns.

Step 002, forming, on the substrate having the gate metal layer, a gate pattern with a gate photoresist pattern, the gate pattern comprising a plurality of gate sub-patterns formed from the gate metal layer, the gate photoresist pattern comprising a plurality of gate photoresist sub-patterns, the width of each gate photoresist sub-pattern in the gate photoresist pattern being greater than the width of each gate sub-pattern in the gate pattern.

Step 003, altering a temperature of the gate photoresist pattern, so as to enable the width of the gate photoresist sub-patterns in the gate photoresist pattern to be changed.

Step 004, forming lightly doped drains (LDDs) at two sides of a preset area of the active layer sub-pattern in the active layer of the substrate having the changed gate photoresist pattern, the preset area being a projection area of the gate sub-pattern on the active layer sub-pattern, the length of each LDD is (a−b)/2, wherein a is the width of the gate photoresist sub-pattern in the changed gate photoresist pattern, b is the width of the gate sub-pattern in the gate pattern.

Step 005, stripping the changed gate photoresist pattern.

To sum up, by using the method for manufacturing an array substrate provided by the embodiment of the present invention, a gate pattern with a gate photoresist pattern is formed on the substrate having the gate metal layer, the width of the gate photoresist sub-pattern in the gate photoresist pattern can be changed by altering the temperature of the gate photoresist pattern, then LDDs that meet the length requirement are formed at two sides of a preset area of the active layer sub-pattern in the active layer of the substrate having the changed gate photoresist pattern, so that the length of the LDD is controlled. Compared to the control method to the LDD length in the existing method for manufacturing the array substrate, the conditional requirement for the gate line width and the conditional requirement for the LDD length do not have to be met simultaneously, hence, the control flexibility and feasibility to the LDD length can be improved.

Figures 1, 2:
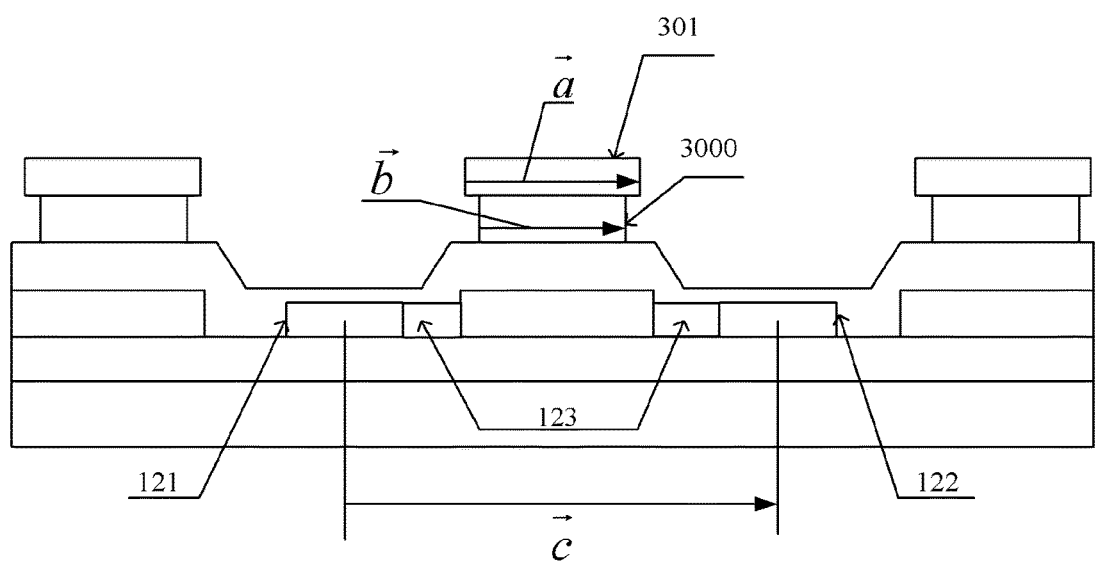
Figure 2:
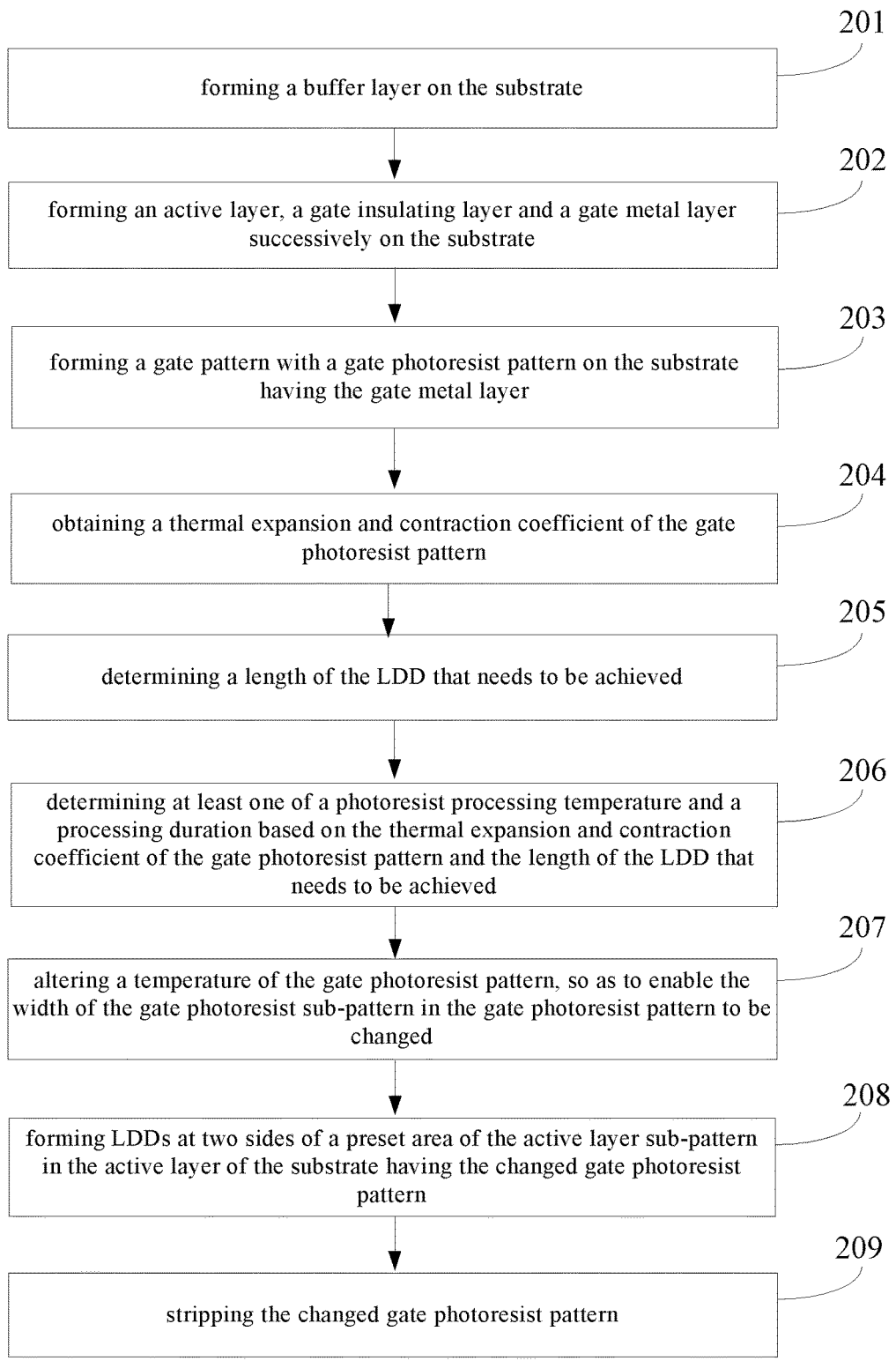

It needs to be supplemented that, as shown in FIG. 1-2, the width direction $\overset{\rightarrow}{a}$ of the gate photoresist sub-pattern in the gate photoresist pattern in step 002 and the width direction $\overset{\rightarrow}{b}$ of the gate sub-pattern 3000 of the gate pattern are parallel to the direction $\overset{\rightarrow}{c}$ from the source 121 to the drain 122 on the array substrate respectively. The LDD is denoted by reference number 123 in FIG. 1-2.

Further, the step 003 may comprise: performing heating treatment to the gate photoresist pattern, so as to enable the width of the gate photoresist sub-pattern in the gate photoresist pattern to be lengthened.

The step 003 may further comprise: performing cooling treatment to the gate photoresist pattern, so as to enable the width of the gate photoresist sub-pattern in the gate photoresist pattern to be shortened.

Prior to the step 003, the method may further comprise: obtaining a thermal expansion and contraction coefficient of the gate photoresist pattern; determining a length of the LDD that needs to be achieved; determining a photoresist processing temperature based on the thermal expansion and contraction coefficient of the gate photoresist pattern and the length of the LDD that needs to be achieved.

Accordingly, the step 003 may comprise: processing the gate photoresist pattern at the photoresist processing temperature, so as to enable the width of the gate photoresist sub-patterns in the gate photoresist pattern to be changed.

Prior to the step 003, the method may further comprise: determining a processing duration based on the thermal expansion and contraction coefficient of the gate photoresist pattern and the length of the LDD that needs to be achieved.

Accordingly, the step 003 may comprise: during the processing duration, altering the temperature of the gate photoresist pattern, so as to enable the width of the gate photoresist sub-patterns in the gate photoresist pattern to be changed.

The step 002 specifically may comprise: forming, on the substrate having the gate metal layer, the gate photoresist pattern through a coating process, an exposing process and a developing process successively; forming the gate metal layer having the gate photoresist pattern as the gate pattern through an etching process.

Prior to the step 001, the method may further comprise: forming, on the substrate, a buffer layer.

In an embodiment, the photoresist may be any one of organic resin materials of DL-1000, Dl-1000C and DTFR-JCW702 types.

To sum up, the method for manufacturing an array substrate provided by this embodiment of the present invention, forms a gate pattern with a gate photoresist pattern on the substrate having the gate metal layer, enables the width of the gate photoresist sub-pattern in the gate photoresist pattern to be changed by altering the temperature of the gate photoresist pattern, then forms LDDs that meet the length requirement at two sides of a preset area of the active layer sub-pattern in the active layer of the substrate having the changed gate photoresist pattern, so that the length of the LDD can be controlled, compared to the control method to the LDD length in the existing method for manufacturing the array substrate, the conditional requirement for the gate line width and the conditional requirement for the LDD length do not have to be met simultaneously, hence, the control flexibility and feasibility to the LDD length can be improved.

Another embodiment of the present invention provides another method for manufacturing an array substrate, which is explained by taking the example of manufacturing a low temperature polycrystalline silicon thin film transistor (LTPS TFT). The LTPS TFT can be used in the backboard of an active matrix organic light emitting diode (AMOLED) display and a thin film transistor liquid crystal display (TFT LCD).

As shown in FIG. 2, the method according to this embodiment may comprise: step 201, forming, on the substrate, a buffer layer.

Figure 3:
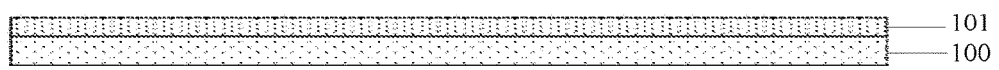
FIG. 3 is a structural schematic view of forming a buffer layer on the substrate provided by another embodiment of the present invention.

As shown in FIG. 3, cleaning treatment is performed to a substrate 100 constituted by transparent materials such as glass, a buffer layer 101 is formed on the substrate using plasma enhanced chemical vapor deposition (PECVD). The buffer layer 101 can be constituted by a single layer or a composite layer formed by silicon oxide and/or silicon nitride, the thickness of the silicon oxide can be 50-100 nm, the thickness of the silicon nitride can be 100-300 nm.

Step 202, forming on the substrate an active layer, a gate insulating layer and a gate metal layer successively.

Figure 4:
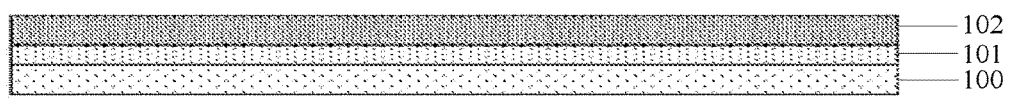
FIG. 4 is a structural schematic view of forming an amorphous silicon thin film on the substrate provided by an embodiment of the present invention.

On the basis of FIG. 3, an amorphous-silicon (a-si) thin film 102 is formed, the thickness of the a-si thin film can be 40-50 nm, a structural schematic view of forming the a-si thin film 102 is as shown in FIG. 4. Subsequently, the substrate will be processed in a high-temperature furnace, so as to achieve the aim of dehydrogenation (reducing the content of hydrogen in the a-si thin film), the content of hydrogen can be controlled within 2%.

Figure 5:
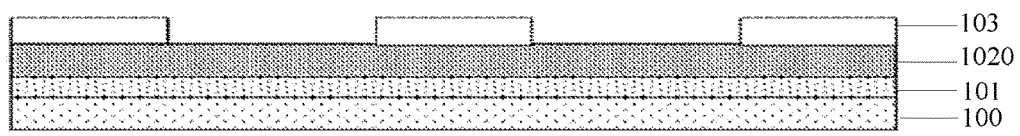
FIG. 5 is a structural schematic view of forming an active layer photoresist on the substrate provided by an embodiment of the present invention.
Figure 6:
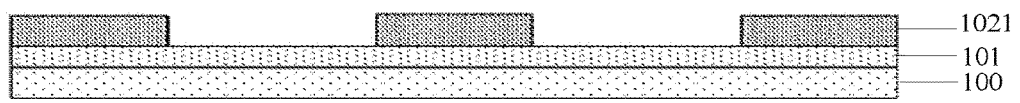
FIG. 6 is a structural schematic view of forming an active layer on the substrate provided by an embodiment of the present invention.

The excimer laser annealing (ELA) treatment is performed to the above substrate, so that the a-si thin film 102 is converted into a polysilicon thin film 1020, then an active layer photoresist 103 is formed through exposing and developing, as shown in FIG. 5. The polysilicon thin film 1020 is etched using an etching method, then the active layer photoresist 103 is stripped using stripping liquid, and an active layer comprising a plurality of active layer sub-patterns 1021 is formed, as shown in FIG. 6.

Subsequently, a gate insulating layer 200 is formed by deposition using PECVD, the structural schematic view of the formed gate insulating layer 200 is shown in FIG. 7. Then, a gate metal layer 300 is formed on the gate insulating layer 200 by way of sputtering, as shown in FIG. 8.

Step 203, forming, on the substrate having the gate metal layer, a gate pattern with a gate photoresist pattern.

The width of the gate photoresist sub-pattern in the gate photoresist pattern may be greater than the width of the gate sub-pattern in the gate pattern.

Figure 10:
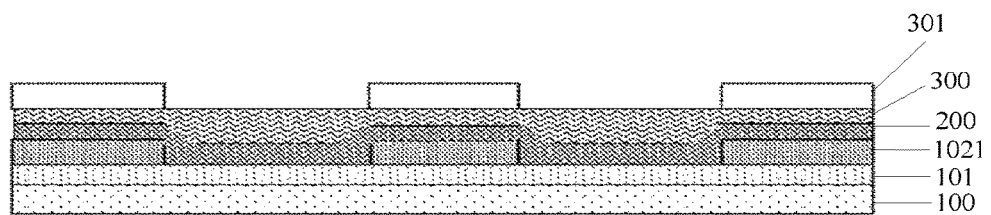
FIG. 10 is a structural schematic view of forming a gate photoresist pattern on the substrate provided by an embodiment of the present invention.

Specifically, as shown in FIG. 9, the step 203 may comprise:

Step 2031, forming, on the substrate having the gate metal layer, the gate photoresist pattern through a coating process, an exposing process and a developing process successively. For example, on the substrate having the gate metal layer 300 in FIG. 8, a gate photoresist pattern is formed through a coating process, an exposing process, and a developing process successively, the gate photoresist pattern comprises a plurality of gate photoresist sub-patterns 301, as shown in FIG. 10.

Figure 11:
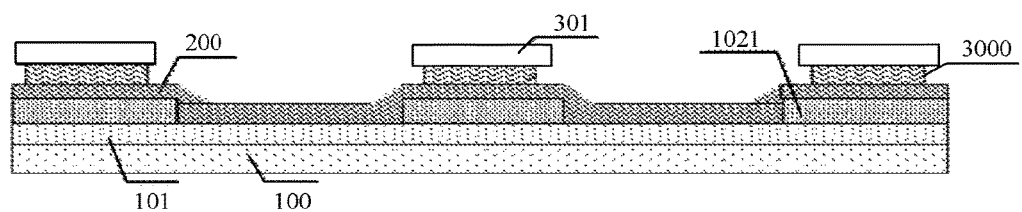
FIG. 11 is a structural schematic view of forming a gate pattern on the substrate provided by an embodiment of the present invention.

Step 2032, forming the gate metal layer having the gate photoresist pattern as the gate pattern through an etching process. For example, the gate metal layer 300 in FIG. 10 can be etched through the etching process, so as to form a gate pattern comprising a plurality of gate sub-patterns 3000, as shown in FIG. 11.

Step 204, obtaining a thermal expansion and contraction coefficient of the gate photoresist pattern.

The thermal expansion and contraction coefficient of the gate photoresist pattern can be obtained based on the constitution of the gate photoresist pattern in actual application, the embodiment of the present invention does not limit the method of obtaining the thermal expansion and contraction coefficient of the gate photoresist pattern.

Step 205, determining a length of the LDD that needs to be achieved. The final specific length of the LDD is determined based on the manufacturing requirement.

Step 206, determining at least one of a photoresist processing temperature and a processing duration based on the thermal expansion and contraction coefficient of the gate photoresist pattern and the length of the LDD that needs to be achieved.

In actual manufacturing process, the corresponding relationship between the thermal expansion and contraction coefficient of the gate photoresist pattern, the LDD length that needs to be achieved and the photoresist processing temperature, the processing duration can be obtained by calculation based on a formula, and can also be obtained directly based on an existing table, which is not limited by the embodiment of the present invention. Assuming that the corresponding relationship between the thermal expansion and contraction coefficient of the gate photoresist pattern, the LDD length that needs to be achieved and the photoresist processing temperature, the processing duration exists in a table, as show in Table 1, it can be seen from Table 1 that when the composition material of the gate photoresist pattern is A, its thermal expansion and contraction coefficient is x1, the LDD length that needs to be achieved is c1, the corresponding photoresist processing temperature is 150° C., and the processing duration is 15 minutes. Exemplarily, the composition material of the gate photoresist pattern can be photoresist of DL-1000, DL-1000C or DTFR-JCW702 types, the sensitivity of such photoresist is relatively high, therefore, when the temperature of the gate photoresist pattern is altered, the width of the gate photoresist sub-pattern in the gate photoresist pattern can be changed more quickly, thereby being favorable for controlling the length of the LDD and reducing the complexity of the whole process.

TABLE 1

| composition material of the gate photoresist pattern | thermal expansion and contraction coefficient of the gate photoresist pattern | the LDD length that needs to be achieved | photoresist processing temperature | processing duration (minute) |
| --- | --- | --- | --- | --- |
| A | x1 | c1 | 150° C. | 15 |
| B | x2 | c2 | 160° C. | 17 |
| C | x3 | c3 | −35° C. | 19 |

Step 207, altering a temperature of the gate photoresist pattern, so as to enable the width of the gate photoresist sub-patterns in the gate photoresist pattern to be changed.

In one embodiment, the photoresist processing temperature can be determined based on the thermal expansion and contraction coefficient of the gate photoresist pattern and the length of the LDD that needs to be achieved, then the step 207 may comprise: processing the gate photoresist pattern at the photoresist processing temperature, so as to enable the width of the gate photoresist sub-pattern in the gate photoresist pattern to be changed; in another embodiment, the processing duration can be determined based on the thermal expansion and contraction coefficient of the gate photoresist pattern and the length of the LDD that needs to be achieved, then the step 207 may comprise: during the processing duration, altering the temperature of the gate photoresist pattern, so as to enable the width of the gate photoresist sub-patterns in the gate photoresist pattern to be changed; in a further embodiment, the photoresist processing temperature and the processing duration can be determined based on the thermal expansion and contraction coefficient of the gate photoresist pattern and the length of the LDD that needs to be achieved, then the step 207 may comprise: during the processing duration, processing the gate photoresist pattern at the photoresist processing temperature, so as to enable the width of the gate photoresist sub-pattern in the gate photoresist pattern to be changed.

Take Table 1 as an example, when the composition material of the gate photoresist pattern is A, the gate photoresist pattern can be processed for 15 minutes at the photoresist processing temperature (i.e. 150° C.), so as to enable the width of the gate photoresist sub-pattern in the gate photoresist pattern to be changed.

In actual manufacturing process, the width of the gate photoresist sub-pattern in the gate photoresist pattern may need to be widened, and may also need to be narrowed, when the width of the gate photoresist sub-pattern in the gate photoresist pattern needs to be widened, the width of the gate photoresist sub-pattern in the gate photoresist pattern can be widened by means of the principle of thermal expansion; when the width of the gate photoresist pattern needs to be narrowed, the width of the gate photoresist sub-pattern in the gate photoresist pattern can be narrowed by means of contraction principle. Hence, the step 207 may comprise: performing heating treatment to the gate photoresist pattern, so as to enable the width of the gate photoresist sub-pattern in the gate photoresist pattern to be widened. For example, the temperature range in the heating treatment can be 150~200° C., or, the step 207 may comprise: performing cooling treatment to the gate photoresist pattern, so as to enable the width of the gate photoresist sub-pattern in the gate photoresist pattern to be narrowed. For example, the temperature range in the cooling treatment can be −30~−40° C. In one embodiment, it can be deemed as performing cooling treatment to the gate photoresist pattern when the photoresist processing temperature is lower than −30° C., and performing heating treatment to the gate photoresist pattern when the photoresist processing temperature is higher than 150° C. The heating duration is about 10 to 20 minutes, the cooling duration can also be about 10 to 20 minutes.

Figure 12:
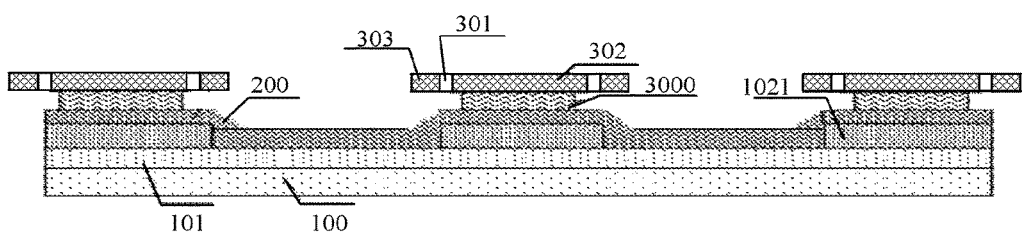
FIG. 12 is a structural schematic view illustrating width change of a gate photoresist sub-pattern in a gate photoresist pattern provided by an embodiment of the present invention.

FIG. 12 is a structural schematic view for illustrating change of the width of the gate photoresist sub-pattern 301 in the gate photoresist pattern achieved by altering the temperature of the gate photoresist pattern. As shown in FIG. 12, when cooling treatment is performed to the gate photoresist pattern, the width of the gate photoresist sub-pattern 301 in the gate photoresist pattern is narrowed, the narrowed gate photoresist sub-pattern in the gate photoresist pattern is denoted by 302; when heating treatment is performed to the gate photoresist pattern, the width of the gate photoresist sub-pattern 301 in the gate photoresist pattern is widened, the widened gate photoresist sub-pattern in the gate photoresist pattern is denoted by 303.

Figure 13:
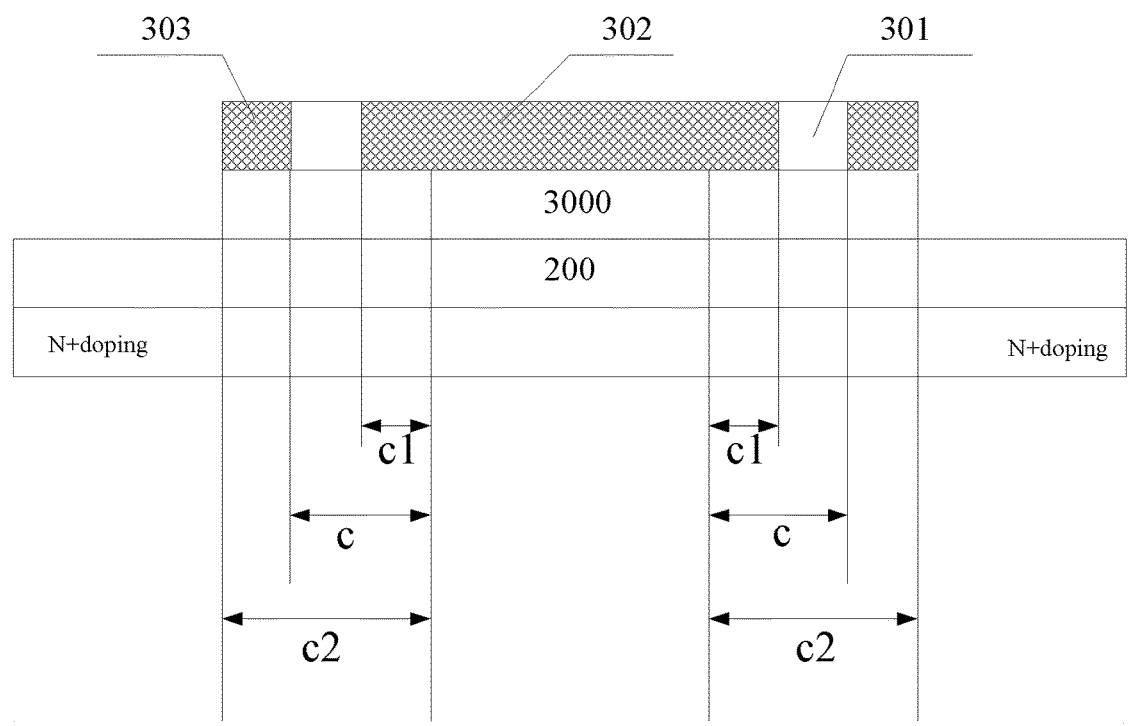
FIG. 13 is a structural schematic view illustrating length change of a single side LDD provided by an embodiment of the present invention.

As shown in FIG. 13, in the event that the gate photoresist sub-pattern 301 in the gate photoresist pattern is not processed, the length of the single side LDD is c, when cooling treatment is performed to the gate photoresist sub-pattern 301 in the gate photoresist pattern, the width of the photoresist sub-pattern 301 in the gate photoresist pattern is narrowed, the narrowed gate photoresist sub-pattern in the gate photoresist pattern is denoted by 302, correspondingly, the length of the single side LDD becomes c1; when heating treatment is performed to the gate photoresist sub-pattern 301 in the gate photoresist pattern, the width of the photoresist sub-pattern 301 in the gate photoresist pattern is widened, the widened gate photoresist sub-pattern in the gate photoresist pattern is denoted by 303, correspondingly, the length of the single side LDD becomes c2, wherein c1<c<c2. The "N+doping" in FIG. 13 refers to N-type (electron-type) high concentration doping. Reference number 3000 in FIG. 13 represents the gate sub-pattern in the gate pattern, and reference number 200 represents the gate insulating layer.

Step 208, forming LDDs at two sides of a preset area of the active layer sub-pattern in the active layer of the substrate having the changed gate photoresist pattern.

The preset area is a projection area of the gate sub-pattern in the gate pattern on the active layer sub-pattern, the length of each LDD is (a−b)/2, wherein a is the width of the gate photoresist sub-pattern 302 or 303 in the changed gate photoresist pattern, b is the width of the gate sub-pattern 3000 in the gate pattern. After altering the temperature of the gate photoresist pattern so as to enable the width of the gate photoresist sub-pattern in the gate photoresist pattern to be changed, the LDD process begins, the length of the LDD will be distributed according to the width of the gate photoresist sub-pattern 301 above the gate sub-pattern 3000 of the gate pattern, and the relationship between the length c of the formed single side LDD and the width a of the changed gate photoresist sub-pattern, the width b of the gate sub-pattern in the gate pattern is $c=(a-b)/2$.

Step 209, stripping the changed gate photoresist pattern.

Figure 14:
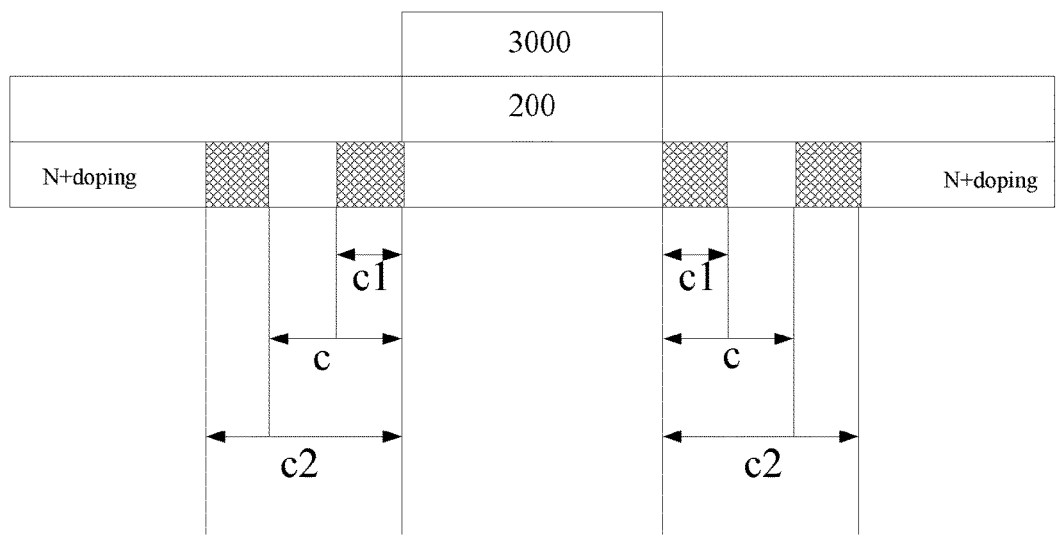
FIG. 14 is a structural schematic view of length distribution of a LDD provided by an embodiment of the present invention.

The stripping operation is performed after the doping is accomplished, to strip the changed photoresist, here, the LDD length distribution is as shown in FIG. 14, c is the length of the single side LDD when the gate photoresist pattern is not processed, c1 is the length of the single side LDD after cooling treatment is performed to the gate photoresist pattern, c2 is the length of the single side LDD after heating treatment is performed to the gate photoresist pattern. Reference number 3000 in FIG. 14 represents the gate sub-pattern in the gate pattern, and reference number 200 represents the gate insulating layer.

It needs to be supplemented that in the actual manufacturing process, after the changed photoresist is stripped, an internal dielectric layer, an internal dielectric photoresist, a source-drain layer, a source-drain layer photoresist, a planar layer and a pixel electrode layer and so on can be formed, the forming process can make reference to the prior art, the embodiment of the present invention will not give more details here.

It needs to be noted that in order to describe conveniently and concisely, reference numbers not explained in the structural schematic view to which each step in this embodiment corresponds can refer to the reference numbers that have been explained in the preceding existing structural schematic views. For example, reference number 100 in FIG. 4 indicates the substrate 100 in FIG. 3, reference number 101 in FIG. 4 indicates the buffer layer 101 in FIG. 3.

The method for manufacturing an array substrate provided by the embodiment of the present invention can control any length of the LDD without influencing the gate line width; and can control any length of the LDD based on the gate etching condition; when the line width is too large or too small after the gate is etched, the relative length to which the LDD corresponds can be controlled by altering the temperature of the gate photoresist pattern based on the actual condition of the etched gate.

To sum up, the method for manufacturing an array substrate provided by this embodiment of the present invention, forms a gate pattern with a gate photoresist pattern on the substrate having the gate metal layer, enables the width of the gate photoresist sub-pattern in the gate photoresist pattern to be changed by altering the temperature of the gate photoresist pattern, then forms LDDs that meet the length requirement at two sides of a preset area of the active layer sub-pattern in the active layer of the substrate having the changed gate photoresist pattern, so that the length of the LDD is controlled, compared to the control method to the LDD length in the existing method for manufacturing the array substrate, the conditional requirement for the gate line width and the conditional requirement for the LDD length do not have to be met simultaneously, hence, the control flexibility and feasibility to the LDD length are improved.

Figure 15:
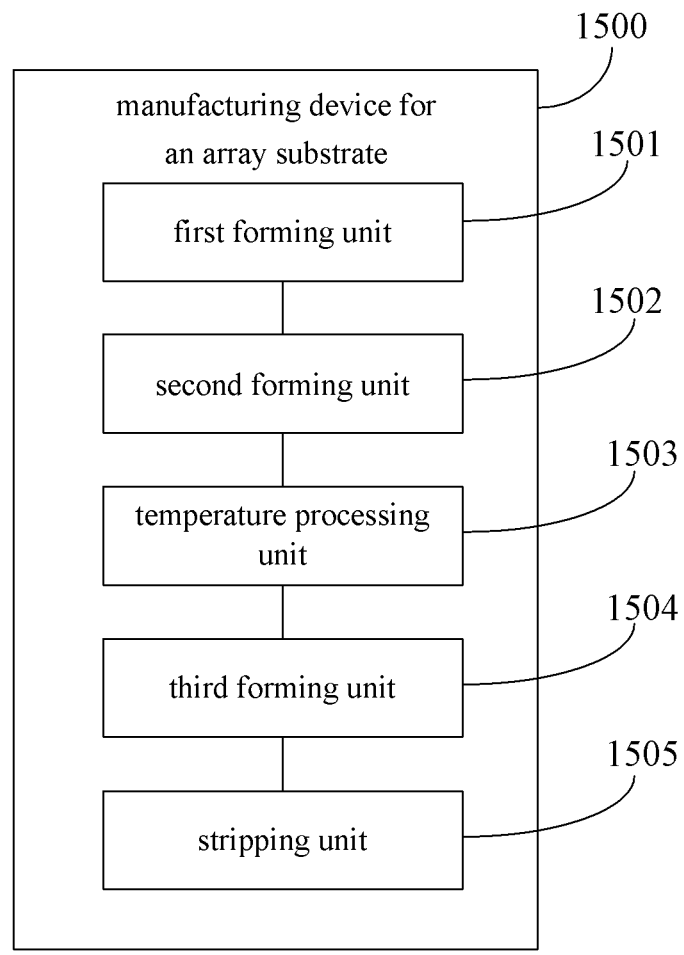
FIG. 15 is a structural schematic view of a manufacturing device for an array substrate provided by an embodiment of the present invention.

Another embodiment of the present invention provides a manufacturing device 1500 for an array substrate, as shown in FIG. 15, the manufacturing device 1500 may comprise: a first forming unit 1501, a second forming unit 1502, a temperature processing unit 1503, a third forming unit 1504 and a stripping unit 1505.

The first forming unit 1501 is used for forming, on a substrate, an active layer, a gate insulating layer and a gate metal layer successively, the active layer comprising a plurality of active layer sub-patterns.

The second forming unit 1502 is used for forming, on the substrate having the gate metal layer, a gate pattern with a gate photoresist pattern, the gate pattern comprising a plurality of gate sub-patterns formed from the gate metal layer, the gate photoresist pattern comprising a plurality of gate photoresist sub-patterns, the width of each gate photoresist sub-pattern in the gate photoresist pattern being greater than the width of each gate sub-pattern in the gate pattern.

The temperature processing unit 1503 is used for altering a temperature of the gate photoresist pattern, so as to enable the width of the gate photoresist sub-pattern in the gate photoresist pattern to be changed.

The third forming unit 1504 is used for forming lightly doped drains (LDDs) at two sides of a preset area of the active layer sub-pattern in the active layer of the substrate having the changed gate photoresist pattern, the preset area being a projection area of the gate sub-pattern on the active layer sub-pattern, the length of each LDD is $(a-b)/2$, wherein a is the width of the gate photoresist sub-pattern in the changed gate photoresist pattern, b is the width of the gate sub-pattern in the gate pattern.

The stripping unit 1505 is used for stripping the changed gate photoresist pattern.

To sum up, the manufacturing device for an array substrate provided by this embodiment of the present invention, forms a gate pattern with a gate photoresist pattern on the substrate having the gate metal layer, enables the width of the gate photoresist sub-pattern in the gate photoresist pattern to be changed by altering the temperature of the gate photoresist pattern using a temperature processing unit, then forms LDDs that meet the length requirement at two sides of a preset area of the active layer sub-pattern in the active layer of the substrate having the changed gate photoresist pattern, so that the length of the LDD is controlled, compared to the control technology to the LDD length in the existing method for manufacturing the array substrate, the conditional requirement for the gate line width and the conditional requirement for the LDD length do not have to be met simultaneously, hence, the control flexibility and feasibility to the LDD length are improved.

Figure 16:
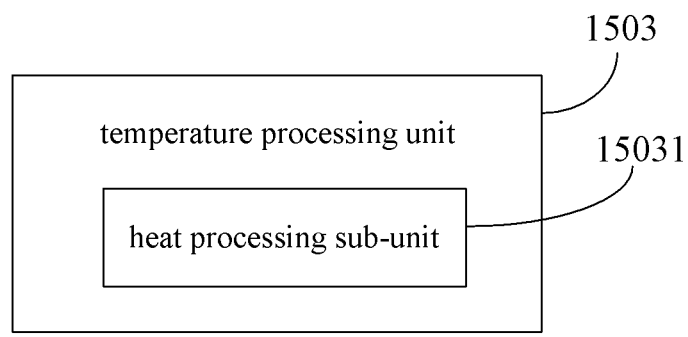
FIG. 16 is a structural schematic view of a temperature processing unit provided by an embodiment of the present invention.

Further, as shown in FIG. 16, the temperature processing unit 1503 may comprise a heat processing sub-unit 15031 for performing heating treatment to the gate photoresist pattern, so as to enable the width of the gate photoresist sub-pattern in the gate photoresist pattern to be lengthened.

Figure 17:
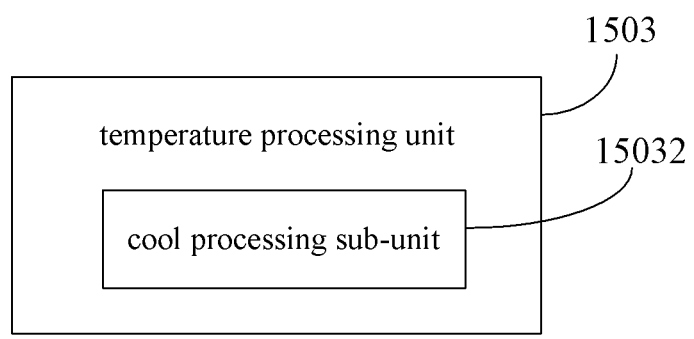
FIG. 17 is a structural schematic view of a temperature processing unit provided by another embodiment of the present invention.

As shown in FIG. 17, the temperature processing unit 1503 may comprise a cool processing sub-unit 15032 for performing cooling treatment to the gate photoresist pattern, so as to enable the width of the gate photoresist sub-pattern in the gate photoresist pattern to be shortened.

Figure 18:
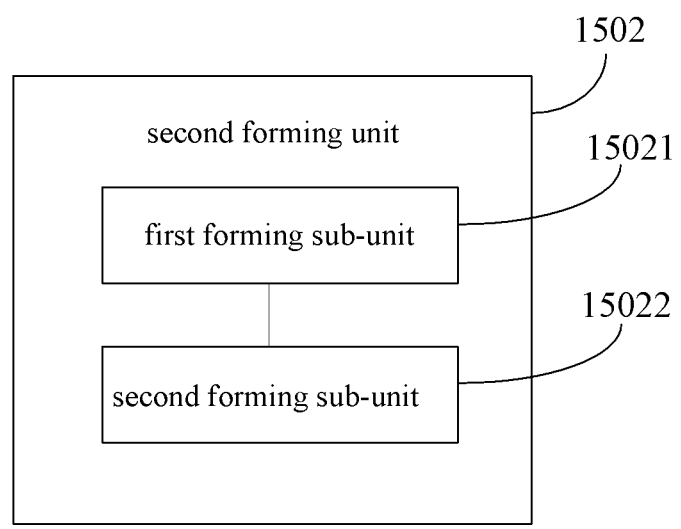
FIG. 18 is a structural schematic view of a second forming unit provided by an embodiment of the present invention.

As shown in FIG. 18, the second forming unit 1502 may comprise:

a first forming sub-unit 15021 for forming, on the substrate having the gate metal layer, the gate photoresist pattern through a coating process, an exposing process and a developing process successively;

a second forming sub-unit 15022 for forming the gate metal layer having the gate photoresist pattern as the gate pattern through an etching process.

To sum up, the manufacturing device for an array substrate provided by this embodiment of the present invention, forms a gate pattern with a gate photoresist pattern on the substrate having the gate metal layer, enables the width of the gate photoresist sub-pattern in the gate photoresist pattern to be changed by altering the temperature of the gate photoresist pattern using a temperature processing unit, then forms LDDs that meet the length requirement at two sides of a preset area of the active layer sub-pattern in the active layer of the substrate having the changed gate photoresist pattern, so that the length of the LDD is controlled, compared to the control technology to the LDD length in the existing method for manufacturing the array substrate, the conditional requirement for the gate line width and the conditional requirement for the LDD length do not have to be met simultaneously, hence, the control flexibility and feasibility to the LDD length are improved.

Figure 19:
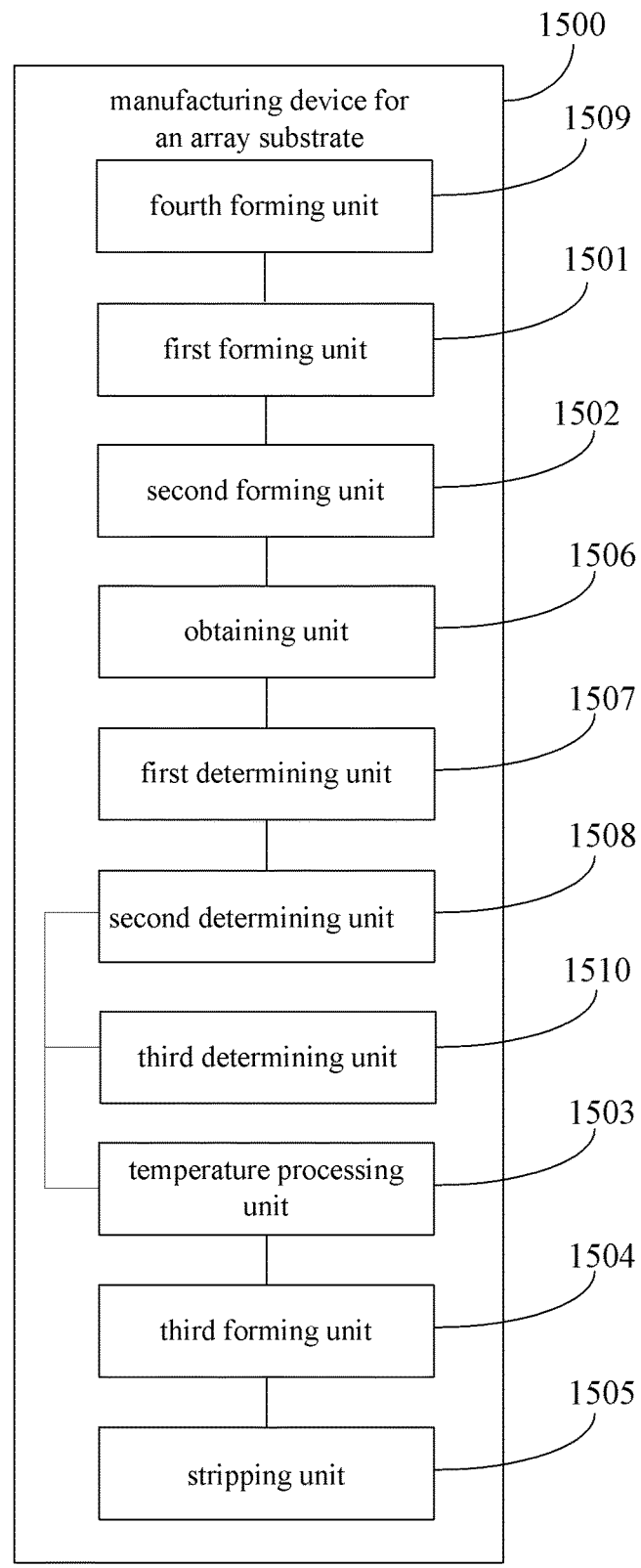
FIG. 19 is a structural schematic view of a manufacturing device for an array substrate provided by another embodiment of the present invention.

A further embodiment of the present invention provides another manufacturing device 1500 for an array substrate, as shown in FIG. 19, the manufacturing device 1500 may comprise a first forming unit 1501, a second forming unit 1502, a temperature processing unit 1503, a third forming unit 1504, a stripping unit 1505, an obtaining unit 1506, a first determining unit 1507, a second determining unit 1508 and a fourth forming unit 1509.

The first forming unit 1501 is used for forming, on a substrate, an active layer, a gate insulating layer and a gate metal layer successively, the active layer comprising a plurality of active layer sub-patterns.

The second forming unit 1502 is used for forming, on the substrate having the gate metal layer, a gate pattern with a gate photoresist pattern, the gate pattern comprising a plurality of gate sub-patterns formed from the gate metal layer, the gate photoresist pattern comprising a plurality of gate photoresist sub-patterns, the width of each gate photoresist sub-pattern in the gate photoresist pattern being greater than the width of each gate sub-pattern in the gate pattern.

The temperature processing unit 1503 is used for altering a temperature of the gate photoresist pattern, so as to enable the width of the gate photoresist sub-patterns in the gate photoresist pattern to be changed.

The third forming unit 1504 is used for forming lightly doped drains (LDDs) at two sides of a preset area of the active layer sub-pattern in the active layer of the substrate having the changed gate photoresist pattern, the preset area being a projection area of the gate sub-pattern on the active layer sub-pattern, the length of each LDD is (a−b)/2, wherein a is the width of the gate photoresist sub-pattern in the changed gate photoresist pattern, b is the width of the gate sub-pattern in the gate pattern.

The stripping unit 1505 is used for stripping the changed gate photoresist pattern.

The obtaining unit 1506 is used for obtaining a thermal expansion and contraction coefficient of the gate photoresist pattern.

The first determining unit 1507 is used for determining a length of the LDD that needs to be achieved.

The second determining unit 1508 is used for determining a photoresist processing temperature based on the thermal expansion and contraction coefficient of the gate photoresist pattern and the length of the LDD that needs to be achieved.

The fourth forming unit 1509 is used for forming, on the substrate, a buffer layer.

The third determining unit 1510 is used for determining a processing duration based on the thermal expansion and contraction coefficient of the gate photoresist pattern and the length of the LDD that needs to be achieved.

Figure 20:
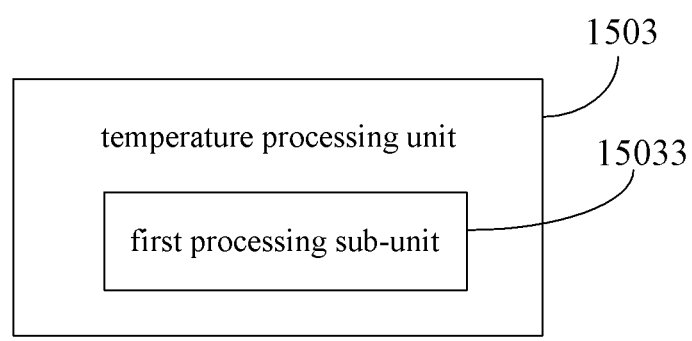
FIG. 20 is a structural schematic view of a temperature processing unit provided by another embodiment of the present invention.

Further, as shown in FIG. 20, the temperature processing unit 1503 to which the second determining unit 1508 corresponds may comprise a first processing sub-unit 15033 for processing the gate photoresist pattern at the photoresist processing temperature, so as to enable the width of the gate photoresist sub-patterns in the gate photoresist pattern to be changed.

Figure 21:
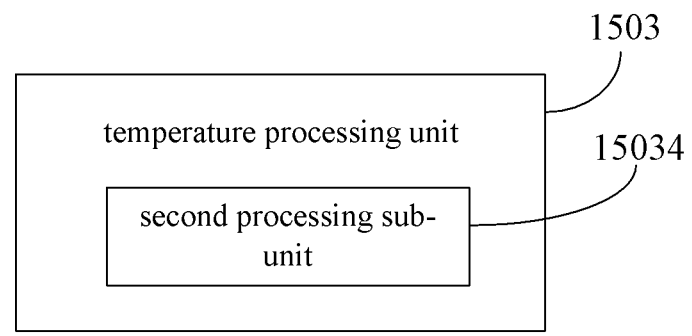
FIG. 21 is a structural schematic view of a temperature processing unit provided by a further embodiment of the present invention.

As shown in FIG. 21, the temperature processing unit 1503 to which the third determining unit 1510 corresponds may comprise a second processing sub-unit 15034 for altering the temperature of the gate photoresist pattern during the processing duration, so as to enable the width of the gate photoresist sub-patterns in the gate photoresist pattern to be changed.

It needs to be supplemented that the temperature processing unit and the second forming unit may also be explained with reference to FIG. 16, FIG. 17 and FIG. 18, which will not be repeated here.

To sum up, the manufacturing device for an array substrate provided by this embodiment of the present invention, forms a gate pattern with a gate photoresist pattern on the substrate having the gate metal layer, enables the width of the gate photoresist sub-pattern in the gate photoresist pattern to be changed by altering the temperature of the gate photoresist pattern using a temperature processing unit, then forms LDDs that meet the length requirement at two sides of a preset area of the active layer sub-pattern in the active layer of the substrate having the changed gate photoresist pattern, so that the length of the LDD is controlled, compared to the control technology to the LDD length in the existing method for manufacturing the array substrate, the conditional requirement for the gate line width and the conditional requirement for the LDD length do not have to be met simultaneously, hence, the control flexibility and feasibility to the LDD length are improved.

The skilled person in the art can understand that, in order to describe conveniently and concisely, the specific operating process of the devices and units described above can make reference to the corresponding process in the preceding method embodiments, which will not be repeated here.

What are stated above are just some embodiments of the present invention, which are not used for limiting the present invention, any modifications, equivalents, and improvements and the like made within the spirit and principle of the present invention should be covered within the protection scope of the present invention.

The invention claimed is:

1. A method for manufacturing an array substrate, wherein the method comprises:
forming an active layer, a gate insulating layer and a gate metal layer successively on a substrate, the active layer comprising a plurality of active layer sub-patterns;
forming a gate pattern with a gate photoresist pattern on the substrate having the gate metal layer, the gate pattern comprising a plurality of gate sub-patterns formed from the gate metal layer, the gate photoresist pattern comprising a plurality of gate photoresist sub-patterns, the width of each gate photoresist sub-pattern in the gate photoresist pattern being greater than the width of each gate sub-pattern in the gate pattern;
altering a temperature of the gate photoresist pattern, so as to enable the width of the gate photoresist sub-pattern in the gate photoresist pattern to be changed;
forming lightly doped drains (LDDs) at two sides of a preset area of the active layer sub-pattern in the active layer of the substrate having the changed gate photoresist pattern, the preset area being a projection area of the gate sub-pattern on the active layer sub-pattern, the length of each LDD is (a−b)/2, wherein a is the width of the gate photoresist sub-pattern in the changed gate photoresist pattern, b is the width of the gate sub-pattern in the gate pattern;

stripping the changed gate photoresist pattern.

2. The method according to claim 1, wherein the step of altering a temperature of the gate photoresist pattern, so as to enable the width of the gate photoresist sub-pattern in the gate photoresist pattern to be changed comprises:

performing heating treatment to the gate photoresist pattern, so as to enable the width of the gate photoresist sub-pattern in the gate photoresist pattern to be lengthened.

3. The method according to claim 2, wherein prior to altering a temperature of the gate photoresist pattern, so as to enable the width of the gate photoresist sub-pattern in the gate photoresist pattern to be changed, the method further comprises:

obtaining a thermal expansion and contraction coefficient of the gate photoresist pattern;

determining a length of the LDD that needs to be achieved;

determining a photoresist processing temperature based on the thermal expansion and contraction coefficient of the gate photoresist pattern and the length of the LDD that needs to be achieved;

wherein the step of altering a temperature of the gate photoresist pattern, so as to enable the width of the gate photoresist sub-pattern in the gate photoresist pattern to be changed comprises:

processing the gate photoresist pattern at the photoresist processing temperature, so as to enable the width of the gate photoresist sub-pattern in the gate photoresist pattern to be changed.

4. The method according to claim 1, wherein the step of altering a temperature of the gate photoresist pattern, so as to enable the width of the gate photoresist sub-pattern in the gate photoresist pattern to be changed comprises:

performing cooling treatment to the gate photoresist pattern, so as to enable the width of the gate photoresist sub-pattern in the gate photoresist pattern to be shortened.

5. The method according to claim 4, wherein prior to altering a temperature of the gate photoresist pattern, so as to enable the width of the gate photoresist sub-pattern in the gate photoresist pattern to be changed, the method further comprises:

obtaining a thermal expansion and contraction coefficient of the gate photoresist pattern;

determining a length of the LDD that needs to be achieved;

determining a photoresist processing temperature based on the thermal expansion and contraction coefficient of the gate photoresist pattern and the length of the LDD that needs to be achieved;

wherein the step of altering a temperature of the gate photoresist pattern, so as to enable the width of the gate photoresist sub-pattern in the gate photoresist pattern to be changed comprises:

processing the gate photoresist pattern at the photoresist processing temperature, so as to enable the width of the gate photoresist sub-pattern in the gate photoresist pattern to be changed.

6. The method according to claim 1, wherein prior to altering a temperature of the gate photoresist pattern, so as to enable the width of the gate photoresist sub-pattern in the gate photoresist pattern to be changed, the method further comprises:

obtaining a thermal expansion and contraction coefficient of the gate photoresist pattern;

determining a length of the LDD that needs to be achieved;

determining a photoresist processing temperature based on the thermal expansion and contraction coefficient of the gate photoresist pattern and the length of the LDD that needs to be achieved;

wherein the step of altering a temperature of the gate photoresist pattern, so as to enable the width of the gate photoresist sub-pattern in the gate photoresist pattern to be changed comprises:

processing the gate photoresist pattern at the photoresist processing temperature, so as to enable the width of the gate photoresist sub-pattern in the gate photoresist pattern to be changed.

7. The method according to claim 6, wherein prior to altering a temperature of the gate photoresist pattern, so as to enable the width of the gate photoresist sub-pattern in the gate photoresist pattern to be changed, the method further comprises:

determining a processing duration based on the thermal expansion and contraction coefficient of the gate photoresist pattern and the length of the LDD that needs to be achieved;

wherein the step of altering a temperature of the gate photoresist pattern, so as to enable the width of the gate photoresist sub-pattern in the gate photoresist pattern to be changed comprises:

during the processing duration, altering the temperature of the gate photoresist pattern, so as to enable the width of the gate photoresist sub-pattern in the gate photoresist pattern to be changed.

8. The method according to claim 1, wherein the step of forming a gate pattern with a gate photoresist pattern on the substrate having the gate metal layer comprises:

forming the gate photoresist pattern through a coating process, an exposing process and a developing process successively on the substrate having the gate metal layer;

forming the gate metal layer having the gate photoresist pattern as the gate pattern through an etching process.

9. The method according to claim 1, wherein prior to forming an active layer, a gate insulating layer and a gate metal layer successively on a substrate, the method further comprises:

forming a buffer layer on the substrate.

10. The method according to claim 1, wherein the photoresist is any one of organic resin materials of DL-1000, Dl-1000C and DTFR-JCW702 types.

* * * * *